(12) United States Patent
Morisue et al.

(10) Patent No.: US 7,517,791 B2
(45) Date of Patent: Apr. 14, 2009

(54) METHOD FOR MANUFACTURING SEMICONDUCTOR DEVICE

(75) Inventors: Masafumi Morisue, Kanagawa (JP); Shunpei Yamazaki, Tokyo (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 466 days.

(21) Appl. No.: 11/283,965

(22) Filed: Nov. 22, 2005

(65) Prior Publication Data

US 2006/0115982 A1 Jun. 1, 2006

(30) Foreign Application Priority Data

Nov. 30, 2004 (JP) ............... 2004-347810

(51) Int. Cl.
*H01L 21/4763* (2006.01)
(52) U.S. Cl. ............... 438/622; 438/627; 438/637
(58) Field of Classification Search ............... 438/622, 438/625, 627–629, 637–641; 257/E21.575, 257/E21.576, E21.577, E21.578, E21.579
See application file for complete search history.

(56) References Cited

U.S. PATENT DOCUMENTS

| | | | |
|---|---|---|---|
| 6,309,957 B1 | 10/2001 | Tu et al. | |
| 6,376,353 B1 | 4/2002 | Zhou et al. | |
| 6,383,920 B1 | 5/2002 | Wang et al. | |
| 6,399,486 B1 | 6/2002 | Chen et al. | |
| 6,429,118 B1 | 8/2002 | Chen et al. | |
| 6,492,708 B2 | 12/2002 | Acosta et al. | |
| 6,514,855 B1 | 2/2003 | Suzuki et al. | |
| 6,720,230 B2 | 4/2004 | Acosta et al. | |
| 6,734,029 B2 | 5/2004 | Furusawa | |
| 6,753,249 B1 | 6/2004 | Chen et al. | |
| 6,897,433 B2 | 5/2005 | Itoh et al. | |

(Continued)

FOREIGN PATENT DOCUMENTS

JP 2001-179167 7/2001

(Continued)

OTHER PUBLICATIONS

"Introduction of porous low-k has begun a full-scale it has started with a spin coating method," Nikkei Microdevices, Nov. 1, 2004, No. 233, pp. 58-65.

*Primary Examiner*—Thanhha Pham
(74) *Attorney, Agent, or Firm*—Nixon Peabody LLP; Jeffrey L. Costellia; Anthony J. Canning

(57) ABSTRACT

It is an object of the present invention to provide a method for manufacturing a semiconductor device in which a contact hole with an opening having a high aspect ratio can be favorably filled without using a conventional CMP process. It is another object of the present invention to provide a method for forming a wiring with fewer steps than a conventional method and to provide a method for manufacturing a highly integrated semiconductor device with a high yield. According to the present invention, a film having a water repellent surface is formed over a surface of an insulating film having plural air holes, a region having a hydrophilic surface is formed by irradiating with light a part of the film having the water repellent surface, and a conductive film is formed by discharging and baking a liquid material having a conductive particle over the region having the hydrophilic surface.

24 Claims, 11 Drawing Sheets

U.S. PATENT DOCUMENTS

| | | |
|---|---|---|
| 6,946,381 B2 | 9/2005 | Hwang |
| 2002/0130386 A1 | 9/2002 | Acosta et al. |
| 2003/0174552 A1 | 9/2003 | Itoh et al. |
| 2004/0002208 A1* | 1/2004 | Takigawa et al. ............ 438/624 |
| 2005/0191847 A1 | 9/2005 | Misawa et al. |
| 2006/0113671 A1 | 6/2006 | Isa et al. |
| 2006/0115983 A1 | 6/2006 | Fujii et al. |
| 2006/0116000 A1 | 6/2006 | Yamamoto |

FOREIGN PATENT DOCUMENTS

| | | |
|---|---|---|
| JP | 2001-332092 | 11/2001 |
| JP | 2002-164635 | 6/2002 |

* cited by examiner

162

152

163

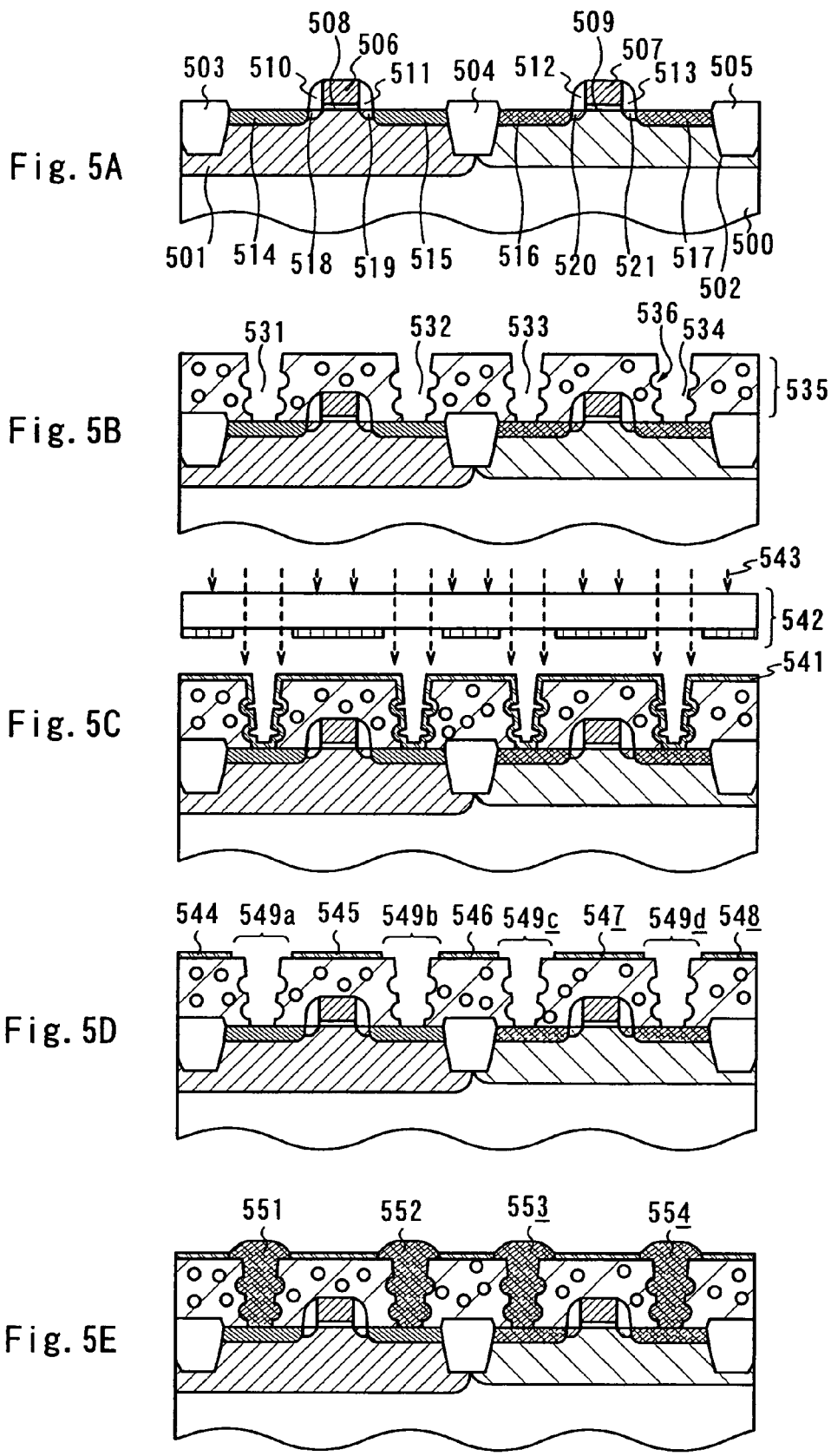

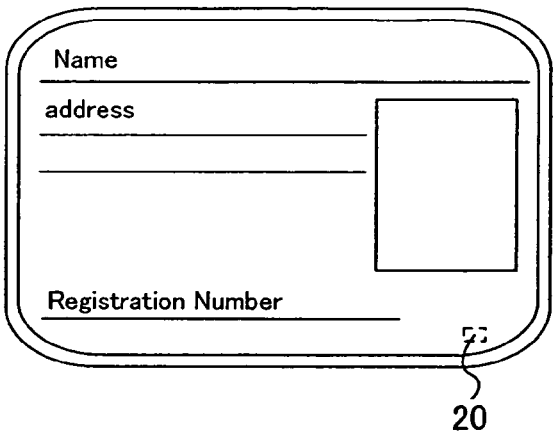
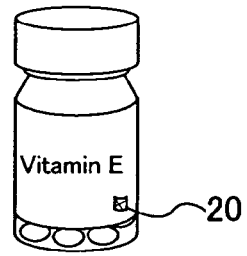
Fig. 11A
Fig. 11B
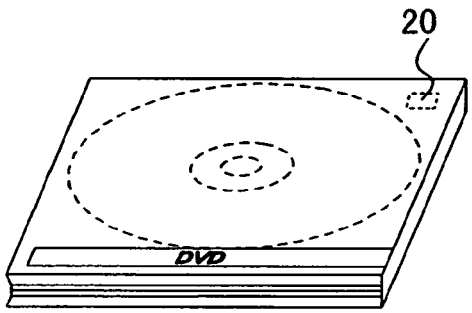
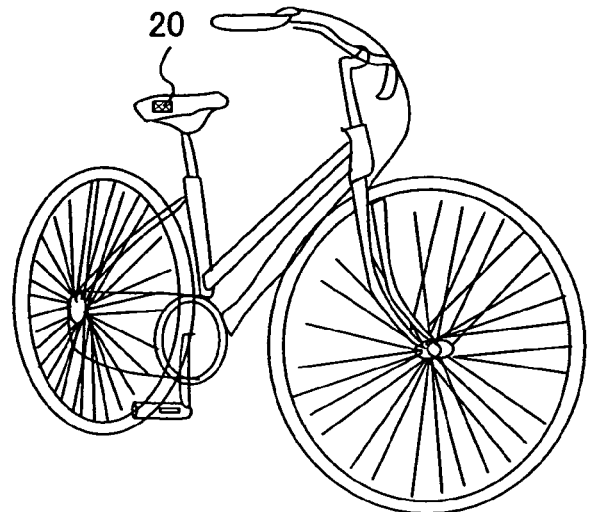
Fig. 11C
Fig. 11D
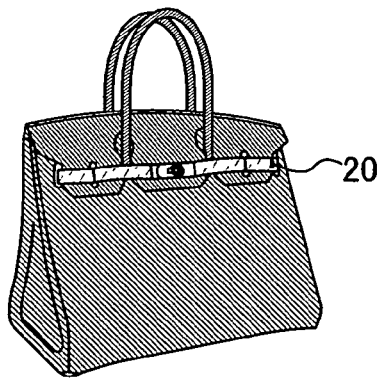
Fig. 11E

METHOD FOR MANUFACTURING SEMICONDUCTOR DEVICE

BACKGROUND OF THE INVENTION

1. Field of the Invention

The present invention relates to a method for manufacturing a semiconductor device.

2. Related Art

In recent years, size reduction of an element such as an active element formed over a semiconductor substrate has been advanced with increase in an integration scale of a semiconductor integrated circuit. Meanwhile, despite improvement of performance of an element with its size reduction, wirings for connecting the elements are difficult to be narrowed in accordance with the size reduction, because of restrictions on current density and the like. In order to solve this problem, a multilayer structure has been employed in which active elements are connected by forming a plurality of wiring layers. In particular, in an integrated circuit for a specific purpose such as a gate array (ASIC: Application Specific Integrated Circuit) as a structure for increasing the number of wiring layers, the number of wiring layers reaches as many as five or six. Accordingly, the number of connections between the respective elements and wirings and between the overlapping wiring layers becomes extremely large.

On the other hand, since there is a demand of improving performance and decreasing power consumption of a large-scale integrated circuit (LSI) as well as reducing a wiring width, it is necessary to lower the height of a wiring so as to decrease a capacitance between the wirings within the same wiring layer. Consequently, it has been examined to use a wiring material having low electric resistance and high electromigration resistance, that is, high allowable current density, such as copper. In the case of using copper which has low electric resistance so as to increase the allowable current density, an embedded wiring obtained by a chemical mechanical polishing (hereinafter referred to as CMP) technique of metal is suggested because copper itself is difficult to process. Specifically, a dual damascene method is given. According to the dual damascene method, a wiring leading portion and a plug portion can be simultaneously formed with one conductive film by embedding the conductive film in a contact hole for electrically connecting an upper wiring and a lower wiring at the time when the wiring is embedded in an interlayer insulating film.

In another technique for decreasing the capacitance between the wirings, a low dielectric constant material is used for an interlayer film. There are many known combinations of a low dielectric constant material with the dual damascene method. Above all, a technique in which a porous material is used as a dielectric material has been proposed and examined extensively to achieve the decrease in delay due to the wiring resistance and the wiring capacitance (see Non-Patent Document 1: Nikkei Microdevices (Nikkei Business Publications, Inc.), pp. 58 to 65, November, 2004). A porous material having a siloxane bond, such as a porous silica material is mainly examined, and the general composition is $SiO_xC_yH_z$.

An ideal porous low dielectric constant film has a structure in which air holes (also referred to as airspaces or pores) each of which is independent and has a diameter of 1 to 2 nm distribute uniformly in the film. As a method to achieve this structure, a technique by spin coating and baking is given. As a forming method by spin coating, such a method is examined that a polymer material which evaporates at a certain temperature is mixed into a porous material and these are evaporated through a heat treatment so that air holes are formed in an insulating film.

As for an example of a dual damascene method using SiLK (registered trademark) as a low dielectric constant material, Patent Document 1 (U.S. Pat. No. 6,383,920) may be referred to.

However, in order to decrease the dielectric constant of the porous insulating film to be typically less than 2.5, the pore ratio of the insulating film is preferably 30% or more. However, as the pore ratio gets higher, the mechanical strength of the insulating film becomes lower, which causes a problem in that the insulating film may be ground excessively or a conductive film for forming a wiring may be peeled off in a CMP process.

Moreover, in a conventional dual damascene process, it is necessary to fill a contact hole with a conductive film so that even a bottom portion of the contact hole is filled because the formation of a wiring and the filling of the contact hole are conducted at the same time. Therefore, the conductive film is embedded into the connection hole and a wiring groove by conducting a reflow process to the conductive film. However, the conductive film cannot be completely embedded into an interlayer insulating film having a dual damascene structure with an opening having an aspect ratio of approximately 4 to 5, causing a problem in that a void or a coverage defect portion is easily formed in the connection hole and the wiring groove to decrease the yield.

Moreover, a large number of steps are required to form a wiring having a dual damascene structure, which includes a step of etching to form a connection hole and a wiring groove, a step of electroplating copper, a CMP step, and the like. Therefore, throughput has decreased, and economical and environmental problems due to the low throughput were caused.

Furthermore, a dual damascene process includes a polishing step. Therefore, in steps of manufacturing semiconductor elements such as display devices over a large substrate, the degree of the polishing is likely to vary. This makes it difficult to manufacture a semiconductor device with a high yield because some problems occur in which the wirings short out, the thicknesses of the wirings vary, and so on.

SUMMARY OF THE INVENTION

The present invention is made in view of such conventional problems, and it is an object of the present invention to provide a method for manufacturing a semiconductor device in which even a contact hole with an opening having a high aspect ratio can be favorably filled without using a conventional CMP process. It is another object of the present invention to provide a method for forming a wiring with fewer steps than a conventional method. Further, it is another object of the present invention to provide a method for manufacturing a highly integrated semiconductor device with a high yield.

According to the present invention, a film having a water repellent surface is formed over a surface of an insulating film having a plurality of air holes; a region having a hydrophilic surface is formed by irradiating with light a part of the film having the water repellent surface; and then a conductive film is formed by discharging and baking a liquid material having a conductive particle over the region having the hydrophilic surface.

In other words, according to the present invention, a porous insulating film is formed over a first conductive film; a part of the porous insulating film is etched to expose a part of the first conductive film; a film having a water repellent surface is formed over a surface of the porous insulating film and the exposed part of the first conductive film; a region having a hydrophilic surface is formed by irradiating with light a part of the film having the water repellent surface; and a second conductive film is formed by discharging and baking a liquid material having a conductive material over the region having the hydrophilic surface.

The second conductive film serves as a wiring and a plug.

According to one aspect of the present invention, a method for manufacturing a semiconductor device comprises the steps of forming a porous insulating film over a single-crystal semiconductor substrate; forming a contact hole by etching the porous insulating film; forming a film having a water repellent surface over a surface of the porous insulating film and a surface of the contact hole; forming a region having a hydrophilic surface by irradiating with light a part of the film having the water repellent surface formed over the surface of the contact hole; and forming a conductive film by discharging and baking a liquid material having a conductive particle over the region having the hydrophilic surface.

According to another aspect of the present invention, a method for manufacturing a semiconductor device comprises the steps of forming a porous insulating film over a single-crystal semiconductor substrate; etching the porous insulating film to expose a part of the single-crystal semiconductor substrate and to form a contact hole; forming a film having a water repellent surface over a surface of the porous insulating film, a surface of the contact hole, and a surface of the exposed part of the single-crystal semiconductor substrate; forming a region having a hydrophilic surface by irradiating with light a part of the film having the water repellent surface formed over the surface of the contact hole and the surface of the exposed part of the single-crystal semiconductor substrate; and forming a conductive film to be connected to the single-crystal semiconductor substrate by discharging and baking a liquid material having a conductive particle over the region having the hydrophilic surface.

The conductive film serves as a wiring and a plug.

According to another aspect of the present invention, a method for manufacturing a semiconductor device comprises the steps of forming a first conductive film over a single-crystal semiconductor substrate; forming a porous insulating film over the first conductive film; etching the porous insulating film to expose a part of the first conductive film and to form a contact hole; forming a film having a water repellent surface over a surface of the porous insulating film, a surface of the contact hole, and a surface of the exposed part of the first conductive film; forming a region having a hydrophilic surface by irradiating with light a part of the film having the water repellent surface formed over the surface of the contact hole and the surface of the exposed part of the first conductive film; and forming a second conductive film to be connected to the first conductive film by discharging and baking a liquid material having a conductive particle over the region having the hydrophilic surface.

The second conductive film serves as a wiring and a plug.

The porous insulating film is formed by heating an applied insulating material. Further, the porous insulating film may be formed by a plasma CVD method.

According to the present invention, a wiring can be formed at the same time as filling a contact hole without using CMP. Thus, it is possible to form a highly adhesive wiring without excessively grinding the insulating film.

Further, since a liquid material containing a conductive particle is discharged into a contact hole by a droplet discharging method and then baked to form a conductive film, the conductive film can be completely embedded into the contact hole so that a void and a coverage defect can be prevented.

This makes it possible to manufacture a semiconductor device with a high yield.

Moreover, a wiring can be formed at the same time as filling a contact hole in an insulating film formed over a large substrate. This makes it possible to form a semiconductor device with a high yield. Since a porous insulating film has low dielectric constant, a parasitic capacitance between the wirings can be relaxed. Consequently, the thickness of an interlayer insulating film can be decreased, which can increase the throughput of a display device.

BRIEF DESCRIPTION OF THE DRAWINGS

In the accompanying drawings:

FIGS. 5A to 5E are cross-sectional views for showing manufacturing steps of a semiconductor device according to the present invention;

FIGS. 11A to 11E are perspective views for showing applications of a semiconductor device according to the present invention.

DETAILED DESCRIPTION OF THE INVENTION

Figure 1A:
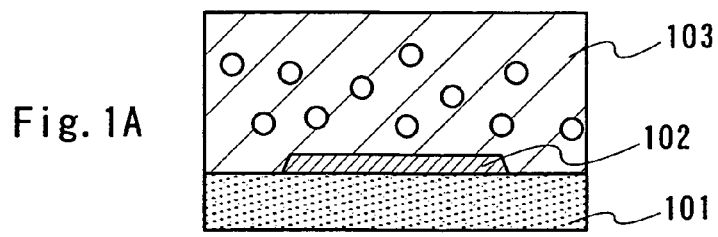
FIGS. 1A to 1E are cross-sectional views for showing manufacturing steps of a semiconductor device according to the present invention.

Embodiment Modes and Embodiments of the present invention will be described with reference to the drawings. However, since the present invention can be embodied in many different modes, it is easily understood by those skilled in the art that the mode and the detail can be variously changed without departing from the scope of the present invention. In all of the drawings for describing the present invention, the same parts or parts having similar functions are denoted with the same reference numerals and the description to such parts is not made repeatedly.

EMBODIMENT MODE 1

Embodiment Mode 1 will describe an example of forming a second wiring which is electrically connected to a first wiring in a semiconductor device by a droplet discharging method, with reference to FIGS. 1A to 1E, FIGS. 2A and 2B, FIGS. 3A and 3B, and FIG. 4. In Embodiment Mode 1, the first wiring serves as a lower wiring and the second wiring serves as an upper wiring in a semiconductor device.

In Embodiment Mode 1, a first conductive film 102 serving as a wiring is formed over an insulating member 101 such as an insulating film or an insulating substrate in accordance with a general manufacturing process of a semiconductor device as shown in FIG. 1A. After that, a porous insulating film 103 is formed as a first interlayer insulating film so as to cover the first conductive film 102. The first conductive film 102 can be formed with a known wiring material. Here, the first conductive film 102 is formed with aluminum.

The porous insulating film 103 can be formed with PSG (phosphosilicate glass) in which phosphorus is added into silicon dioxide, BPSG (borophosphosilicate glass) in which phosphorus and boron are added into silicon dioxide, polyimide, polyacrylic, or the like. Moreover, a porous insulating film having a siloxane bond such as porous MSQ (methylsilsesquioxane), porous HSQ (hydrosilsesquioxane), or porous MHSQ (methylhydrosilsesquioxane) can be formed. A general composition of such a porous insulating film having a siloxane bond is porous $SiO_xC_yH_z$.

The pore ratio of the porous insulating film 103 is preferably in the range of 20 to 90%. The dielectric constant cannot be decreased sufficiently if the pore ratio is lower than 20%. If the pore ratio is higher than 90%, the mechanical strength is not enough.

The porous insulating film 103 may be formed by a CVD method or an evaporation method. Alternatively, the porous insulating film 103 may be formed by heating to bake a liquid material which has been applied by a coating method typified by a spin coating method.

Figure 1B:
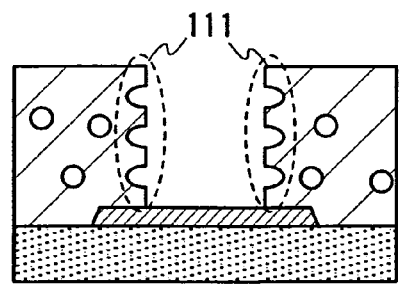

Next, in a first patterning step shown in FIG. 1B, the porous insulating film 103 is etched to expose the first conductive film 102 so that a contact hole is formed. In this step, a concave portion is formed in a surface 111 of a side portion of the contact hole, because an air hole in the porous insulating film is exposed by the etching. Thus, a gap between the concavity and convexity increases.

The surface of the porous insulating film 103 is flat in FIG. 1A. However, a concave portion may be formed, like in the surface 111 of the contact hole. In the latter case, the adhesiveness of a conductive film to be formed later is enhanced further.

Figure 1C:
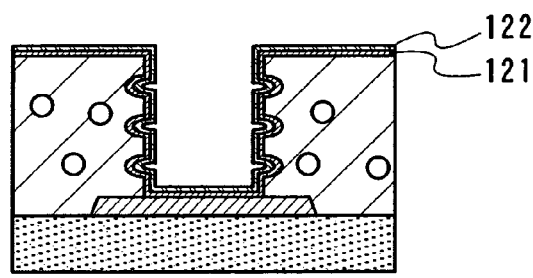

Next, a film 121 having a barrier property may be formed over an exposed part of the first conductive film 102 and the surface of the porous insulating film 103 as shown in FIG. 1C. Here, the film 121 having a barrier property is formed with a multilayer film of a Ti film and a TiN film by a magnetron sputtering method. The film 121 having a barrier property is not limited to the multilayer film of the Ti film and the TiN film and may be any film which has a barrier property against a conductive film to be formed in a later step. The film 121 having the barrier property is appropriately formed by an appropriate method selected from known methods such as an electroplating method, a PVD (Physical Vapor Deposition) method, a CVD (Chemical Vapor Deposition) method, an evaporation method, and an ALD (Atomic Layer Deposition) method.

Next, a film 122 having a water repellent surface is formed over the film 121 having a barrier property.

The film 122 having a water repellent surface can be formed by applying or discharging a liquid repellent material. As a typical example of a liquid repellent material, a compound having a fluorocarbon chain is given.

As a typical example of a material of the film having the water repellent surface, organic silane with its chemical formula expressed as $Rn-Si-X_{(4-n)}$ (n=1, 2, 3) is given. Here, R includes a relatively inactive group such as an alkyl group. X includes a hydrolytic group capable of bonding with a hydroxyl group or absorption water of a base surface, for example a halogen group, a methoxy group, an ethoxy group, an acetoxy group, or the like.

By using fluoroalkylsilane (FAS) having a fluoroalkyl group in R as a typical example of organic silane, the wettability can be decreased. R in FAS has a structure expressed with $(CF_3)(CF_2)_x(CH_2)_y$ (x: an integer number from 0 to 10, y: an integer number from 0 to 4). When plural number of Rs or Xs are bonded with Si, all of the Rs or Xs may be the same or different. As typical FAS, fluoroalkylsilane such as the following is given: heptadefluorotetrahydrodecyltriethoxysilane, heptadecafluorotetrahydrodecyltrichlorosilane, tridecafluorotetrahydrooctyltrichlorosilane, or trifluoropropyltrimethoxysilane.

As a solvent for the liquid repellent material, a hydrocarbon-based solvent such as n-pentane, n-hexane, n-heptane, n-octane, n-decane, dicyclopentane, benzene, toluene, xylene, durene, indene, tetrahydronaphtalene, decahydronaphtalene, or squalene, or tetrahydrofrane is used.

The film 122 having the water repellent surface is formed with FAS here. The film having the water repellent surface may be formed as a monomolecular film. In this case, when a part of the film having the water repellent surface is decomposed, the film can be decomposed in a short time. Moreover, since the film thickness is uniform, the film having the water repellent surface can be decomposed with no variation. By setting the substrate inside an airtight container having FAS, FAS can be chemically adsorbed onto the surface of the porous insulating film to become a monomolecular film, thereby forming the water repellent surface. Alternatively, the water repellent surface can be formed by dipping the substrate in a solution having FAS so that FAS is chemically adsorbed onto the surface of the porous insulating film to become a monomolecular film. Here, the film having the water repellent surface is formed by enclosing the substrate into an airtight container containing a FAS reagent, heating the substrate at 110° C. for five minutes or more, and adsorbing FAS onto the surface of the porous insulating film.

The region having the water repellent surface has a contact angle of 120° or more to water.

Figure 1D:
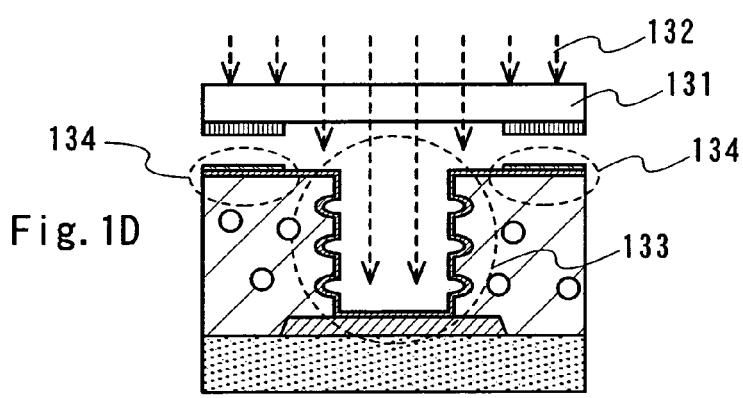

Next, in a second patterning step shown in FIG. 1D, a part of the film having the water repellent surface is decomposed by being irradiated with light 132 using a photo mask 131 corresponding to a pattern of a second conductive film to be formed later. As a result, a functional group having polarity such as an OH group or a COOH group is introduced into a surface of a film provided under a layer having a water repellent surface (here, the layer 121 having the barrier property). Therefore, the surface of the region corresponding to the pattern of the second conductive film is a hydrophilic region where the contact angle to water is 20° or less, preferably 10° or less. Accordingly, surfaces having different wettabilities (a hydrophilic region 133 and a water repellent region 134) exist over the surface of one substrate in accordance with the pattern of the second conductive film.

The light 132 needs to be light having energy high enough to decompose the film having the water repellent surface. For example, light emitted from a lamp or a laser can be appropriately used. Here, the film 122 having the water repellent surface is irradiated with vacuum ultraviolet light (VUV light) to decompose a part of FAS, thereby forming the water repellent region 134 and the hydrophilic region 133.

Figure 1E:
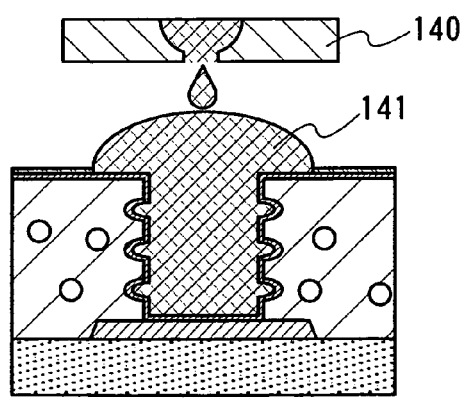

Next, a composition 141 is discharged by using a droplet discharging means 140 as shown in FIG. 1E. The composition is discharged onto a surface of the hydrophilic region 133 formed in advance based on the wiring pattern. The droplet discharging means 140 is a generic term for means for discharging a droplet, such as a nozzle having a discharge outlet for discharging the composition and a head equipped with one or more nozzles. The nozzle of the droplet discharging means 140 has a diameter of 0.02 to 100 μm (preferably 30 μm or less) and the amount of the composition to be discharged from the nozzle is set in the range of 0.001 pl to 100 pl (preferably 10 pl or less). The amount of the discharged composition increases proportionally with the diameter of the nozzle. The distance between a process object and the discharge outlet of the nozzle is preferably as small as possible in order to discharge the composition at a desired position, specifically about 0.1 to 3 mm (preferably 1 mm or less).

As the composition 141 to be discharged from the droplet discharging means 140, a liquid material in which conductive particles are dissolved or dispersed in a solvent is used. The conductive particle corresponds to a microparticle or a dispersive nanoparticle of metal such as Ag, Au, Cu, Ni, Pt, Pd, Ir, Rh, W, or Al. Moreover, a composition containing light-transmitting indium tin oxide (ITO), indium tin oxide containing silicon oxide, zinc oxide, or the like may be discharged. However, in consideration of a specific resistance value, it is preferable to use a solvent in which gold, silver, or copper is dissolved or dispersed for a composition to be discharged from the discharge outlet. It is more preferable to use silver or copper, which has lower electric resistance. If silver or copper is used, a film having a barrier property is preferably provided as a countermeasure against impurities. As the solvent, water, esters such as butyl acetate or ethyl acetate, alcohols such as isopropyl alcohol or ethyl alcohol, an organic solvent such as methyl ethyl ketone or acetone, or the like is used.

Here, the composition is a liquid material in which Ag nanoparticles are dispersed in a solvent (this liquid material is hereinafter referred to as Ag paste). The composition needs to be sufficiently repelled on the water repellent region 134 and to sufficiently wet the hydrophilic region 133. Therefore, in order to fill the contact hole having a high aspect ratio with the composition, the contact angle on the surface of the hydrophilic surface is preferably smaller. Accordingly, it is preferable to select the solvent and the amount of solutes so that the contact angle of the liquid material on the surface of the water repellent region ranges from 60 to 160° (more preferably 90° or more) and the contact angle of the liquid material on the surface of the hydrophilic region is 20° or less (more preferably 10° or less).

Figure 2A:
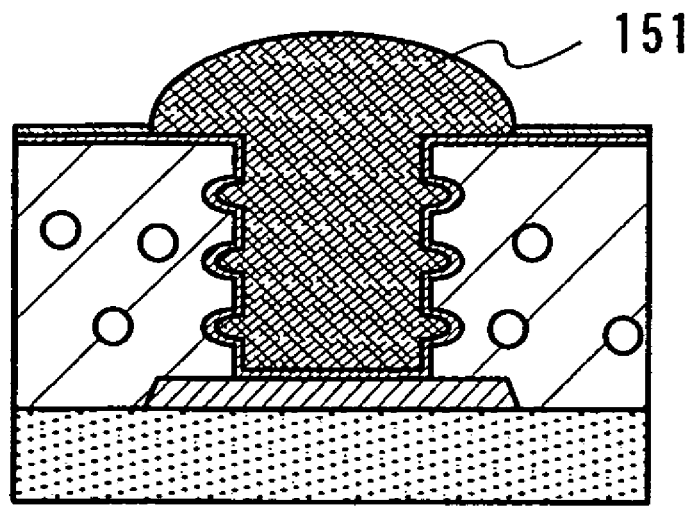
FIGS. 2A and 2B are cross-sectional views for showing a manufacturing step of a semiconductor device according to the present invention.

After discharging the composition, one or both of drying and baking steps are conducted to form a conductive film 151 as shown in FIG. 2A. Although both of the drying and baking steps are heat treatments, the purpose, the temperature, and the time are different respectively. For example, the drying step is performed for three minutes at 100° C., and the baking step is performed for 15 to 30 minutes at 200 to 350° C. The drying and baking steps are conducted under normal pressure or low pressure by laser irradiation, rapid thermal annealing (RTA), a heat furnace, or the like. The timing for conducting this heat treatment is not limited in particular. In order to conduct the drying and baking steps favorably, the substrate may be heated in advance at 100 to 800° C. (preferably 200 to 350° C.) though the temperature depends on the material of the substrate and the like. This step volatilizes the solvent in the composition or removes a dispersing agent chemically. At the same time, peripheral resin is cured and shrunk to make the nanoparticles in contact with each other and to accelerate the fusion and welding of the nanoparticles.

Figure 2B:
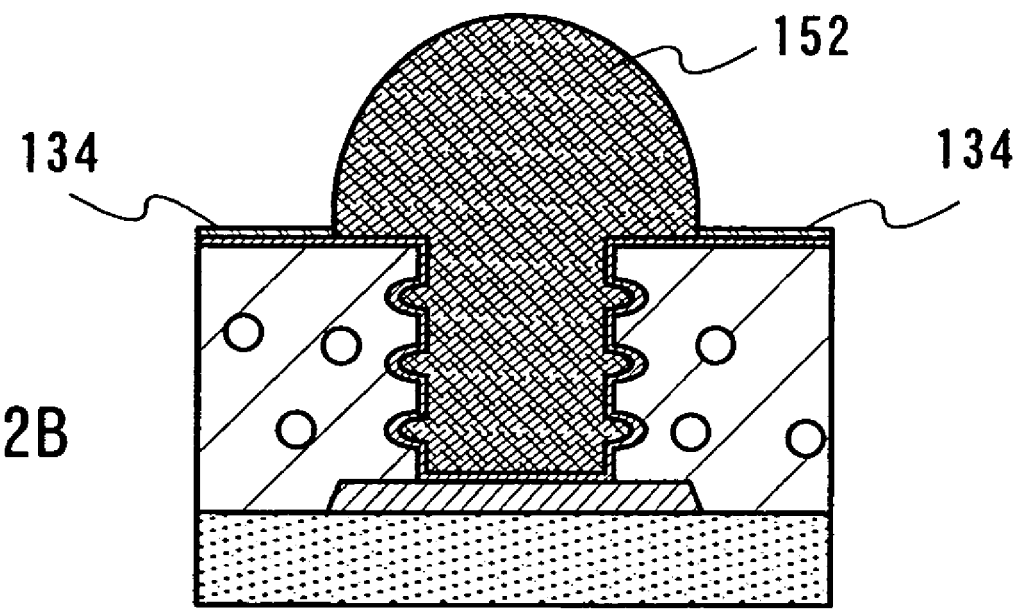

Further, the composition may be discharged multiple times onto the same position until the thickness becomes desired one. Even in this case, since the water repellent region is formed in advance as the wiring pattern, the composition is discharged only onto the conductive layer 151 which is the hydrophilic region and the composition does not spread beyond the designed line width as shown in FIG. 2B. For this reason, a conductive film 152 formed by baking the composition becomes a conductive film having a small width.

Even after the discharged composition is landed on the substrate, the composition remains liquid until the composition is dried. Since the side surface of the contact hole with an opening having a high aspect ratio also has a high hydrophilic property, the contact hole is sufficiently filled.

Figure 3A:
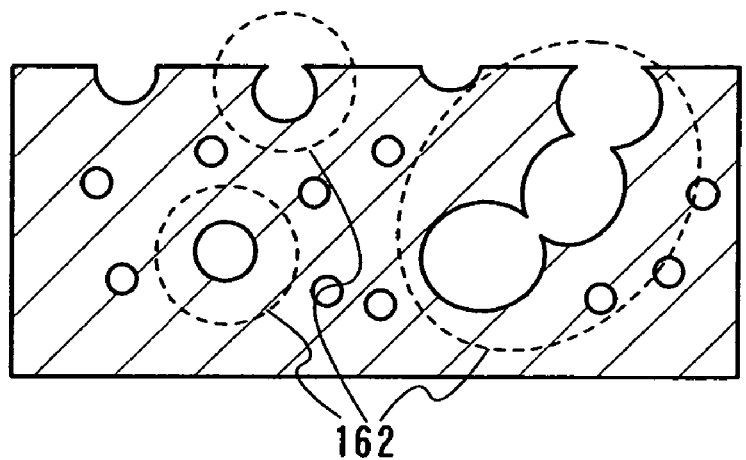
FIGS. 3A and 3B are cross-sectional views for showing a structure of an insulating film according to the present invention.
Figure 3B:
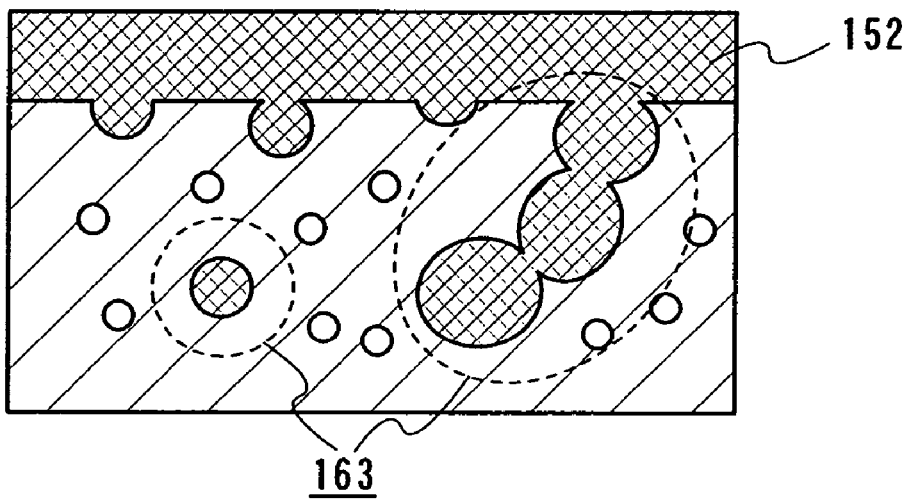

By heating the discharged composition, the nanoparticles are fused and welded so as to solidify. Here, a cross-sectional view of the surface of the porous insulating film 103 is shown in FIGS. 3A and 3B. Since the porous insulating film has a number of concave portions 162 on its surface, the surface is uneven as shown in FIG. 3A. For this reason, an area where the insulating film and the composition are in contact with each other increases and thus the adhesiveness can be improved. As shown in FIG. 3B, a part of the porous insulating film covers a part of the conductive film 163 formed within the concave portion. If the conductive particles are welded to solidify in such a state that the conductive particles fill the concave portion and are covered with the porous insulating film, the conductive film existing in the concave portion works like a needle or a wedge. Such an effect is referred to as an anchorage effect (also referred to as an anchor effect). This increases the resistance against the peeling of the second conductive film 151 and the porous insulating film 103 so that the films are difficult to be peeled off.

Figure 4:
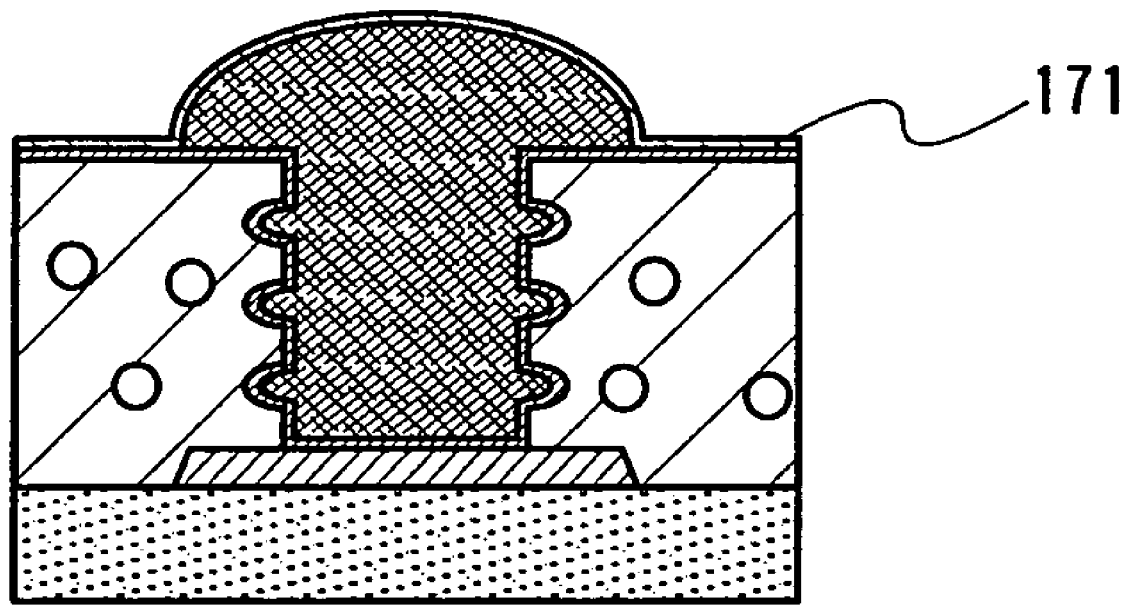
FIG. 4 is a cross-sectional view for showing a structure of a semiconductor device according to the present invention.

Next, after removing the water repellent region 134 with a UV ozone cleaner, a barrier film 171 is formed as shown in FIG. 4. Here, a semiconductor device can be manufactured by forming a silicon nitride film as the barrier film by a known method such as a CVD method. Moreover, if necessary, a porous insulating film is formed and a multilayer wiring is formed in accordance with steps similar to those shown in FIGS. 1A to 1E, so that a semiconductor device can be manufactured.

By these steps, the wiring material can be embedded into the contact hole favorably and the wiring having a predetermined thickness can be formed without forming a wiring groove, so that the excessive wiring material does not need to be removed by CMP. Therefore, the multilayer wiring can be formed at low cost and the yield and the throughput can be improved.

EMBODIMENT MODE 2

Embodiment Mode 2 will describe steps of forming a wiring over a single-crystal semiconductor substrate with reference to FIGS. 5A to 5E, FIGS. 6A and 6B, and FIGS. 7A and 7B.

As shown in FIG. 5A, element separation regions 503 to 505 are formed over a substrate 500. The substrate 500 is a single-crystal semiconductor substrate or a compound semiconductor substrate, typified by an n-type or p-type single-crystal silicon substrate, a GaAs substrate, an InP substrate, a GaN substrate, a SiC substrate, a sapphire substrate, a ZnSe substrate, or the like. Moreover, an SOI (Silicon On Insulator) substrate can also be used. In this embodiment mode, the substrate 500 is a single-crystal silicon substrate. The element separation regions 503 to 505 can be formed by appropriately using a known selective oxidation (LOCOS: Local Oxidation of Silicon) method, trench separation method, or the like. Here, a silicon oxide film is formed as the element separation regions 503 to 505 by a trench separation method. After that, a p well region 501 and an n well region 502 are formed by well ion implantation. Moreover, channel stop ion implantation and/or threshold adjustment ion implantation are/is appropriately conducted.

Subsequently, a surface of the substrate 500 is washed to expose the surface of the substrate 500. After that, a first insulating film is formed by a known method such as a CVD method, a sputtering method, or a thermal oxidation method. Next, a first conductive film is formed over the first insulating film. The first insulating film and the first conductive film can be formed with similar materials by similar methods to those of a known gate insulating film and a known gate electrode, respectively. Then, a mask pattern is formed over the first conductive film and the first conductive film is etched using the mask pattern to form gate electrodes 506 and 507. Next, an impurity element is added to the substrate 500 in a self-aligning manner by using the mask pattern and the gate electrodes 506 and 507 as a mask.

Next, the first insulating film is etched to form gate insulating films 508 and 509 by using the mask pattern and the gate electrodes 506 and 507 as a mask. Subsequently, after removing the mask pattern, a second insulating film is formed. Then, anisotropic etching is conducted to form sidewalls 510 to 513. Next, an impurity element is added by using the gate electrodes 506 and 507 and the sidewalls 510 to 513 as a mask, and then the impurity element is activated by a heat treatment such as a GRTA method or an LRTA method, thereby forming source regions and drain regions 514 to 517 and low-concentration impurity regions 518 to 521. The source region and the drain region 514 and 515 formed in the p well region 501 are $n^+$ regions with phosphorus added, and the low-concentration impurity regions 518 and 519 are $n^-$ regions. The source region and the drain region 516 and 517 formed in the n well region 502 are $p^+$ regions with boron added, and the low-concentration impurity regions 520 and 521 are $p^-$ regions.

Since the $n^-$ region and the $p^+$ region may be appropriately formed, a transistor not having these regions may be formed. Here, although the pMOS transistor and the nMOS transistor are shown, a semiconductor device may be formed with only one of the nMOS transistor and the pMOS transistor.

Next, a third insulating film is formed as shown in FIG. 5B. The third insulating film is formed by a known method such as a CVD method, a sputtering method, or a coating method, and a heat treatment. Here, a silicon oxide film is formed by applying and heating BPSG. The third insulating film is a porous insulating film. Next, the third insulating film is partially etched to form contact holes 531 to 534 and to partially expose the source regions and the drain regions 514 to 517. In the porous insulating film 535 where the contact holes are formed, the side surfaces of the contact holes have small concave portions 536.

After that, a conductive film having a barrier property may be formed over the surface of the porous insulating film.

Next, a film 541 having a water repellent surface is formed over the surface of the porous insulating film 535 where the contact holes are formed, as shown in FIG. 5C. Here, the substrate is enclosed in an airtight container containing a FAS reagent and heated at 110° C. for five minutes or more to form the film 541 having the water repellent surface. The water repellent surface of the film 541 has a contact angle of 120° or more to water.

Figure 7A:
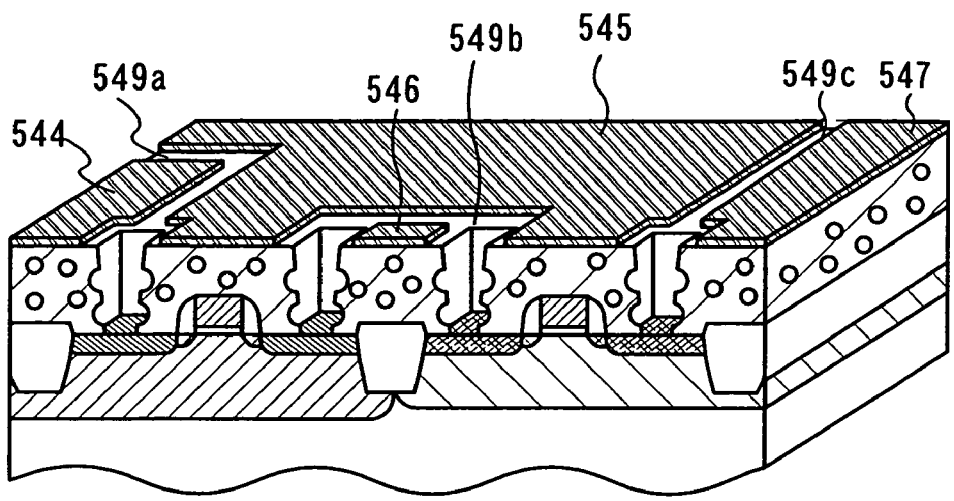
FIGS. 7A and 7B are perspective views for showing manufacturing steps of a semiconductor device according to the present invention.

Next, the film 541 having the water repellent surface is irradiated with vacuum ultraviolet (VUV) light 543 by using a photomask 542 having a wiring pattern so that the film 541 is decomposed. As a result, FAS in regions irradiated with the VUV light is decomposed to form regions 549a to 549d having hydrophilic surfaces, while FAS remains in regions not irradiated with the VUV light to form regions 544 to 548 having water repellent surfaces, as shown in FIG. 5D. A perspective view at this time is shown in FIG. 7A.

Next, Ag paste is discharged onto the regions 549a to 549d having the hydrophilic surfaces; dried by heating for three minutes at 100° C.; and baked by heating for 15 to 30 minutes at 200 to 350° C., thereby forming conductive films 551 to 554 as shown in FIG. 5E. On an extension of the regions 549a to 549d having hydrophilic surfaces, regions 544 to 547 having water repellent surfaces are formed. Therefore, the Ag paste does not spread beyond the designed line width. Moreover, since the contact hole with an opening having a high aspect ratio is sufficiently filled, a conductive film serving as a plug and a wiring can be formed. In addition, Ag nanoparticles in the Ag paste are fused and welded through baking so as to solidify. The Ag nanoparticles can have higher peeling strength because the contact area increases due to the existence of a large number of small holes in the surface of the porous insulating film.

Figure 6A:
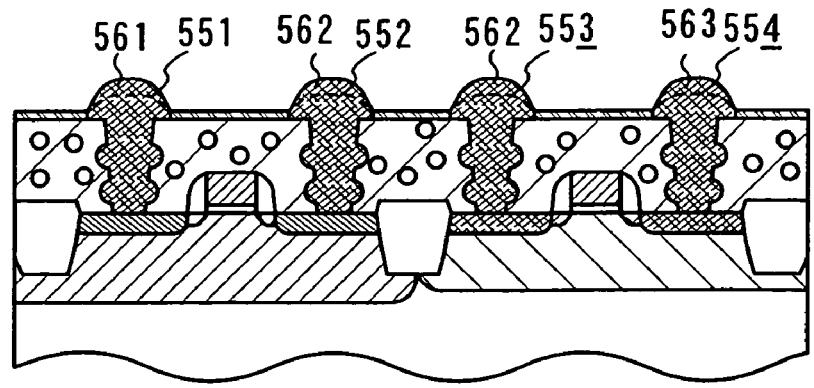
FIGS. 6A and 6B are cross-sectional views for showing manufacturing steps of a semiconductor device according to the present invention.
Figure 7B:
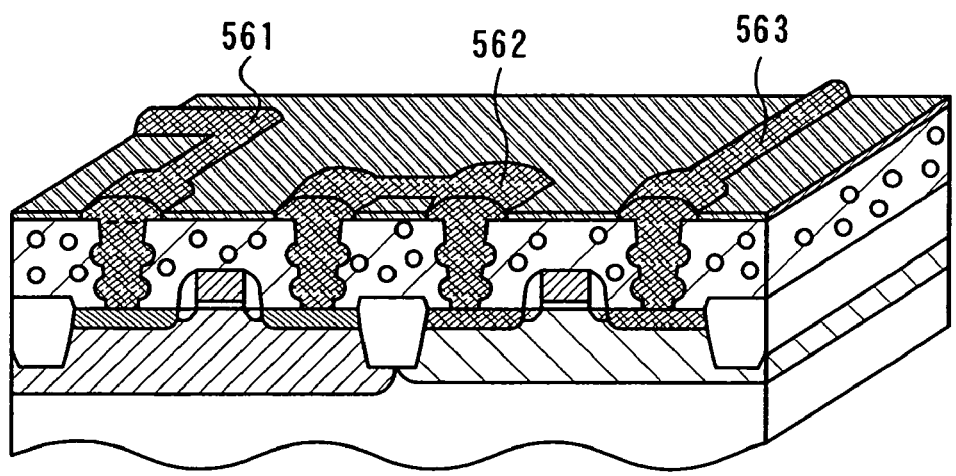

After that, the Ag paste may be dropped multiple times and baked so that the conductive film becomes thicker as shown in FIG. 6A. FIG. 6A shows the conductive films 551 to 554 for connecting plugs and also shows wirings 561 to 563 for increasing the thickness of the conductive films 551 to 554. A perspective view at this time is shown in FIG. 7B.

By these steps, wirings having high adhesiveness can be formed in the porous insulating film.

Next, after removing the regions 544 to 547 having the water repellent surface with a UV ozone cleaner, a silicon nitride film may be formed as a barrier layer by a known method such as a CVD method.

Figure 6B:
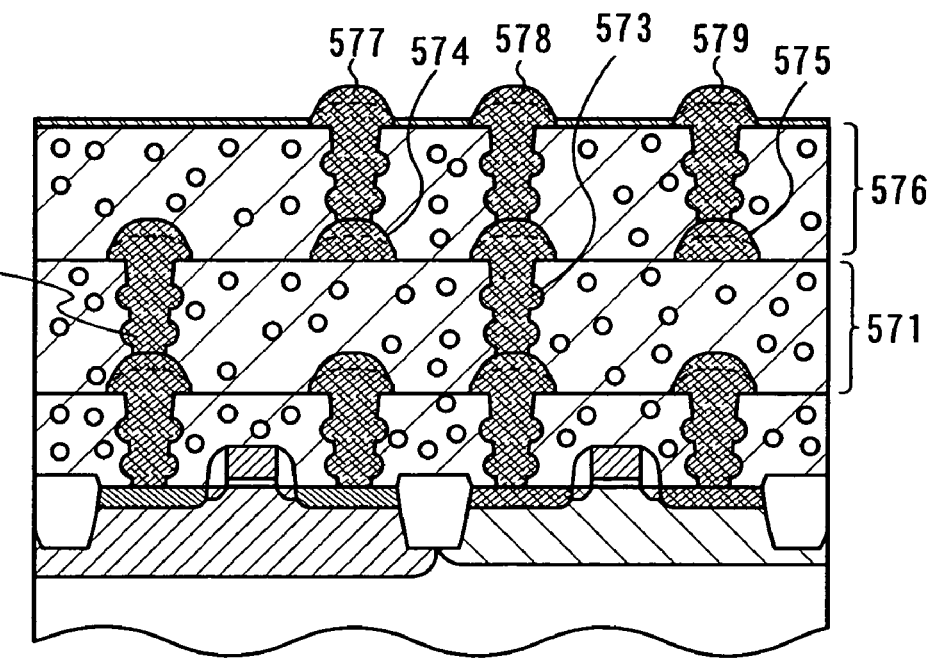

Next, as shown in FIG. 6B, after a porous insulating film 571 having contact holes is formed with the similar material to that of the insulating film 535 over the insulating film 535 and the conductive films 561 to 563, conductive films 572 to 575 are formed with the similar steps to those for forming the conductive films 551 to 553. Subsequently, a porous insulating film 576 having contact holes is formed, and then conductive films 577 to 579 are formed, thereby forming multilayer wirings.

By these steps, the conductive material can be embedded favorably into the contact hole and a semiconductor device having a multilayer wiring structure can be formed without forming a wiring groove. For this reason, the excessive wiring material does not need to be removed with CMP. As a result, the yield and throughput can be improved and the multilayer wiring can be formed at low cost.

By these steps, a semiconductor device having a low dielectric constant insulating film can be formed.

When an SOI (Silicon On Insulator) substrate is used as the substrate 500 and the peeling can be conducted from between the insulating oxide film and the silicon substrate by a known peeling method, a MOS transistor can be peeled. Moreover, by attaching the peeled MOS transistor onto a flexible substrate, a semiconductor device can be thinned.

Besides the MOS transistor, the semiconductor device shown in this embodiment mode can be applied to various semiconductor devices such as a bipolar transistor and can also be applied to a memory and various circuits such as a logic circuit.

EMBODIMENT MODE 3

The porous insulating film and the conductive film shown in Embodiment Mode 1 can be used as an insulating film and a conductive film serving as a wiring and a plug in a display device. Typically, the porous insulating film and the conductive film can be applied to a source line, a drain line, and moreover a gate line connected to a gate electrode and the like in a thin film transistor. Since such a structure can decrease a parasitic capacitance between wirings, an interlayer insulating film can be thinned, which can increase the throughput.

EMBODIMENT 1

Figure 8:
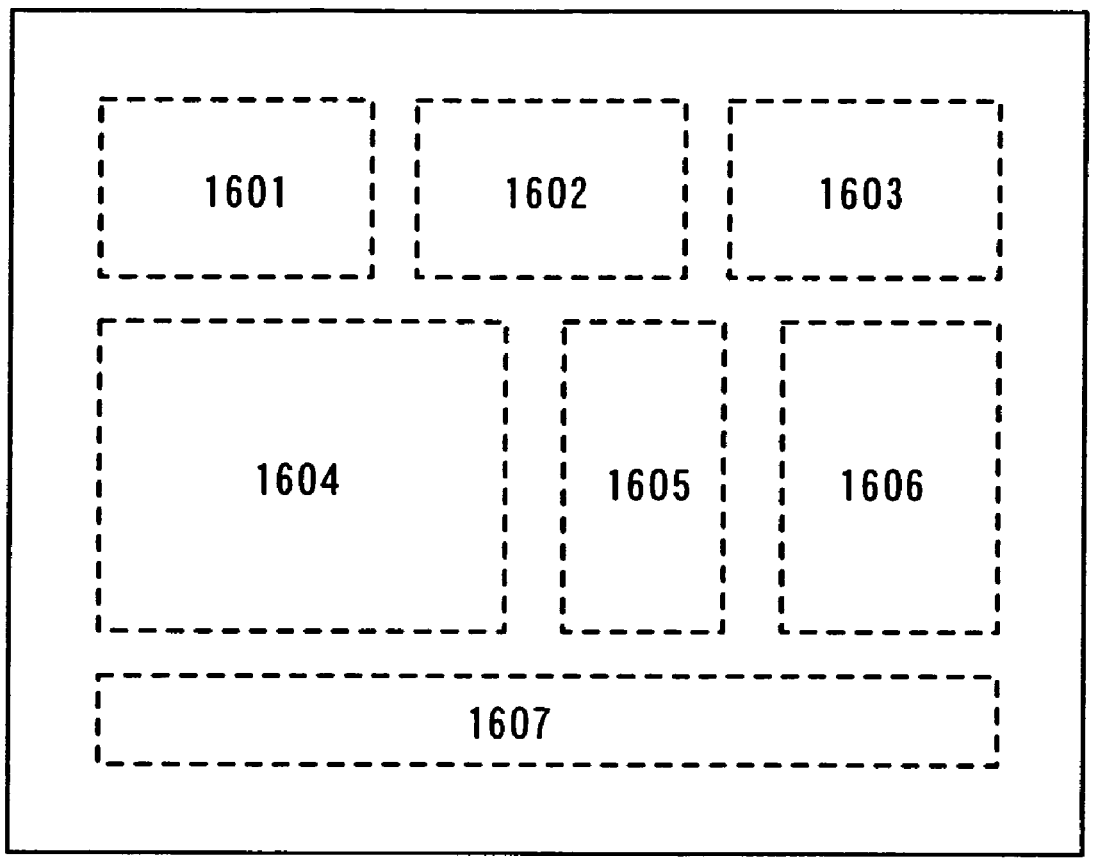
FIG. 8 shows a structure of a semiconductor device according to the present invention.

Embodiment 1 will describe a case in which a semiconductor device of the present invention is applied to a system LSI, with reference to FIG. 8.

A system LSI is an LSI which is built in a device for a specific purpose and which constitutes a system for controlling the device or processing data. The system LSI can be applied to a wide range of purposes, for example, a mobile phone, a PDA, a DSC, a television, a printer, a FAX, a game machine, a navigation system, a DVD player, and the like.

FIG. 8 shows an example of a system LSI, which typically includes a microprocessor 1601, a nonvolatile memory 1604, a clock controller 1603, a main memory 1602, a memory controller 1605, an interrupt controller 1606, an I/O port 1607, and the like. The system LSI shown in FIG. 8 is a simplified example, and circuits of actual system LSIs are designed variously depending on their intended purposes.

By applying Embodiment Mode 1 or Embodiment Mode 2 to a formation method of the insulating film and the conductive film of this embodiment, a highly integrated semiconductor device can be manufactured.

EMBODIMENT 2

Figure 9A:
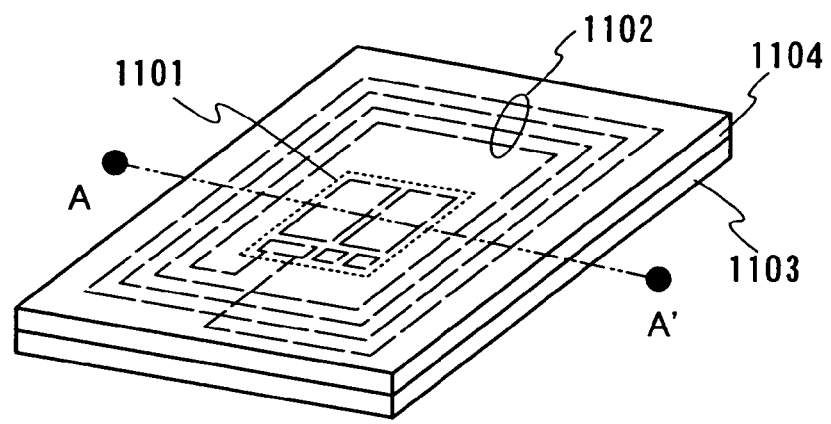
FIGS. 9A and 9B are perspective views for showing a structure of a semiconductor device according to the present invention.

FIG. 9A is a perspective view showing a mode of a contactless RFID (Radio Frequency Identification) tag, a wireless tag, a wireless processor, a wireless memory, an IC card, or the like, which is a semiconductor device of the present invention. A reference numeral 1101 denotes an integrated circuit; 1102, an antenna connected to the integrated circuit 1101; 1103, a substrate; and 1104, a cover material. The antenna 1102 is formed over the substrate 1103 or the cover material 1104, and the integrated circuit 1101 is held between the substrate 1103 and the cover material 1104. The antenna may cover the integrated circuit. In other words, an occupation area of the integrated circuit may be equal to that of the antenna.

Figure 9B:
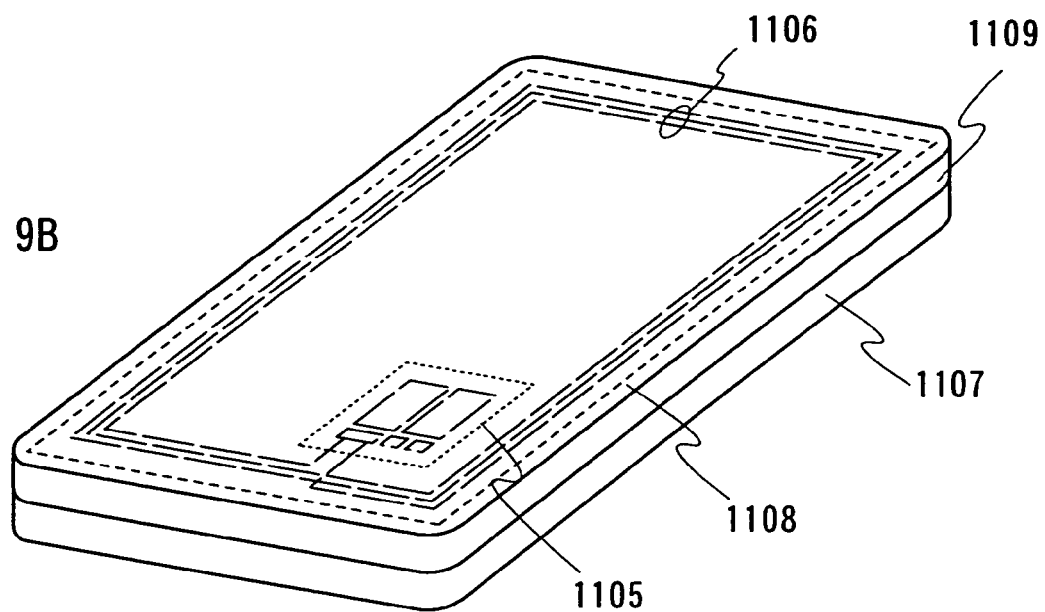

FIG. 9B is a perspective view showing a mode of an IC card, which is a semiconductor device of the present invention. A reference numeral 1105 denotes an integrated circuit; 1106, an antenna connected to the integrated circuit 1105; 1108, a substrate serving as an inlet sheet; and 1107 and 1109, cover materials. The antenna 1106 is formed over the substrate 1108. Further, the integrated circuit 1105 is sandwiched between the substrate 1108 where the antenna is formed and one of the two cover materials 1107 and 1109. The IC card of the present invention may have a display device connected to the integrated circuit 1105.

By applying the formation method of the conductive film shown in Embodiment Mode 1 or Embodiment Mode 2 to the integrated circuits 1101 and 1105, a highly integrated semiconductor device can be manufactured.

EMBODIMENT 3

Figure 10:
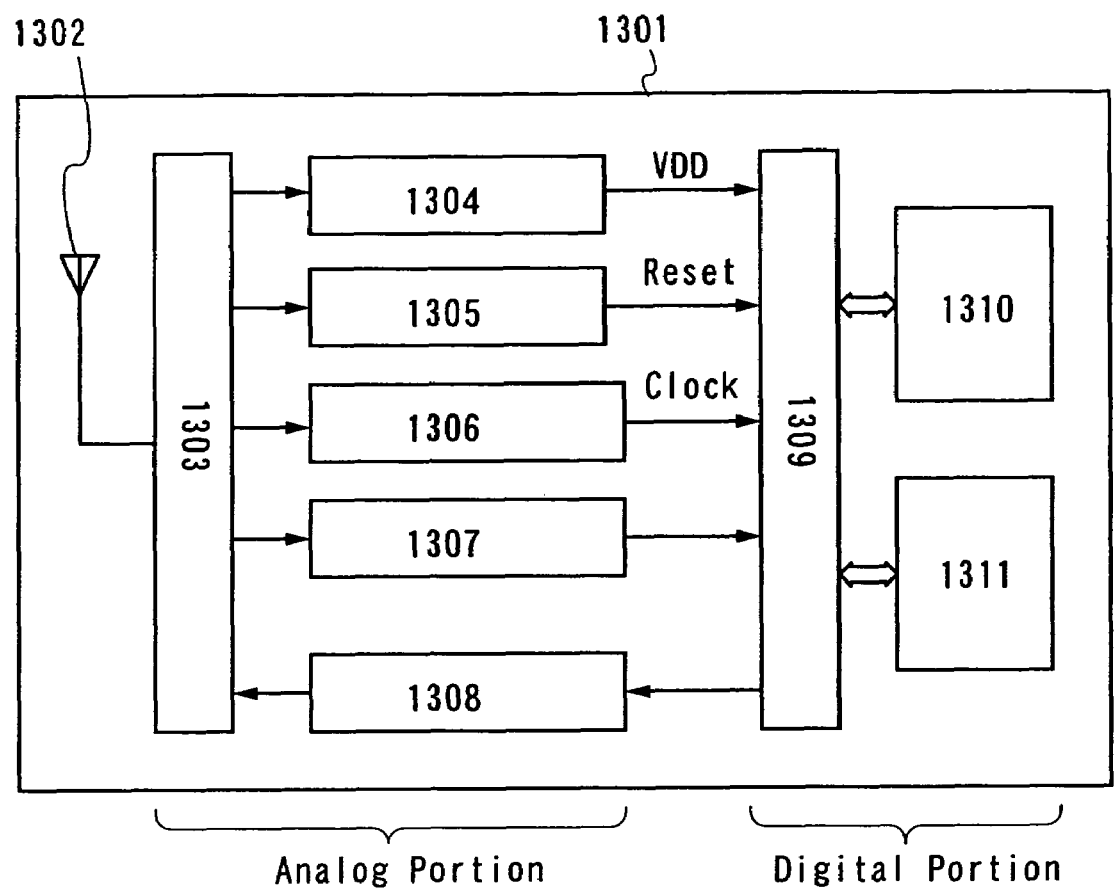
FIG. 10 shows a structure of a semiconductor device according to the present invention.

FIG. 10 is a typical block diagram of the semiconductor device in the above embodiment, typified by a contactless RFID (Radio Frequency Identification) tag, a wireless tag, a wireless processor, a wireless memory, an IC card, or the like. FIG. 10 shows a structure having a simple function for reading fixed data such as identification data. In FIG. 10, a semiconductor device 1301 includes an antenna 1302, a high frequency circuit 1303, a power source circuit 1304, a reset circuit 1305, a clock generation circuit 1306, a data demodulation circuit 1307, a data modulation circuit 1308, a control circuit 1309, a nonvolatile memory 1310, and a ROM 1311.

The high frequency circuit 1303 receives an analog signal from the antenna 1302 and outputs from the antenna 1302 an analog signal received from the data modulation circuit 1308. The power source circuit 1304 is a circuit for generating constant power source from a received signal, the reset circuit 1305 is a circuit for generating a reset signal, the clock generation circuit 1306 is a circuit for generating a clock signal, the data demodulation circuit 1307 is a circuit for extracting data from a received signal, and the data modulation circuit 1308 is a circuit for generating an analog signal which will be outputted to the antenna based on a digital signal received from the control circuit or for changing an antenna characteristic. These circuits constitute an analog portion.

On the other hand, the control circuit 1309 receives data extracted from the received signals and reads out data. Specifically, the control circuit 1309 generates address signals of the nonvolatile memory 1310 and the ROM 1311 to read out the data, and the read data are sent to the data modulation circuit. These circuits constitute a digital portion.

This embodiment can be combined with Embodiment Mode 1 or 2.

EMBODIMENT 4

FIG. 11 shows applications of a semiconductor device 20 in the above embodiment, typified by a contactless RFID (Radio Frequency Identification) tag, a wireless tag, a wireless processor, a wireless memory, an IC card, or the like. The semiconductor device manufactured by the present invention can be applied in a wide range, for example banknotes, coins, documents of value, unregistered bonds, identification certificates (such as a driver's license and a family register, refer to FIG. 11A), pack cases (such as package papers and bottles, refer to FIG. 11B), recording media (such as DVD software and a video tape, refer to FIG. 11C), vehicles (such as bicycles, refer to FIG. 11D), personal belongings (such as bags and pairs of glasses, refer to FIG. 11E), foods, plants, animals, human bodies, clothes, general merchandise, electronic appliances, and the like. The electronic appliances include liquid crystal display devices, EL display devices, television devices (also simply referred to as TVs, TV receiving machines, or television receiving machines), mobile phones, and the like.

The semiconductor device of the present invention is fixed to an object by pasting the device to a surface of the object or embedding the device inside the object. For example, if the object is a book, the device is fixed to the book by embedding the device inside a paper, and if the object is a package made of organic resin, the device is fixed to the package by embedding the device inside the organic resin. By providing the semiconductor device inside a banknote, a coin, documents of value, unregistered bonds, identification certificates, and the like, the forgery can be prevented. Moreover, when the thin film integrated circuit is provided in pack cases, recording media, personal belongings, foods, clothes, general merchandise, electronic appliances, and the like, an inspection system, a system at the rental shop, and the like become more efficient. Even when the semiconductor device of the present invention which is small, thin, and lightweight is mounted onto an object, the design quality will not be degraded.

What is claimed is:

1. A method for manufacturing a semiconductor device comprising:
    forming a porous insulating film over a single-crystal semiconductor substrate;
    forming a contact hole in the porous insulating film;
    forming a film having a water repellent over the porous insulating film and the contact hole;
    forming a region having a hydrophilic surface in a part of the film having the water repellent by irradiating with light the part of the film having the water repellent; and
    forming a conductive film by discharging and baking a liquid material having a conductive particle over the region having the hydrophilic surface.

2. The method for manufacturing a semiconductor device according to claim 1, wherein the conductive film serves as a wiring and a plug.

3. The method for manufacturing a semiconductor device according to claim 1, wherein the porous insulating film is formed by applying an insulating material and then heating the insulating material.

4. The method for manufacturing a semiconductor device according to claim 1, wherein the porous insulating film is formed by a plasma CVD method.

5. The method for manufacturing a semiconductor device according to claim 1, wherein the film having a water repellent has a contact angle of 120° or more to water.

6. The method for manufacturing a semiconductor device according to claim 1, wherein the region having a hydrophilic surface has a contact angle of 20° or less to water.

7. A method for manufacturing a semiconductor device comprising:
   forming a porous insulating film over a single-crystal semiconductor substrate;
   forming a contact hole in the porous insulating film to expose a part of the single-crystal semiconductor substrate;
   forming a film having a water repellent surface over the porous insulating film, the contact hole, and the exposed part of the single-crystal semiconductor substrate;
   forming a region having a hydrophilic surface in a part of the film having the water repellent by irradiating with light the part of the film having the water repellent; and
   forming a conductive film connected to the single-crystal semiconductor substrate by discharging and baking a liquid material having a conductive particle over the region having the hydrophilic surface.

8. The method for manufacturing a semiconductor device according to claim 7, wherein the conductive film serves as a wiring and a plug.

9. The method for manufacturing a semiconductor device according to claim 7, wherein the porous insulating film is formed by applying an insulating material and then heating the insulating material.

10. The method for manufacturing a semiconductor device according to claim 7, wherein the porous insulating film is formed by a plasma CVD method.

11. The method for manufacturing a semiconductor device according to claim 7, wherein the film having a water repellent has a contact angle of 120° or more to water.

12. The method for manufacturing a semiconductor device according to claim 7, wherein the region having a hydrophilic surface has a contact angle of 20° or less to water.

13. A method for manufacturing a semiconductor device comprising:
   forming a first conductive film over a single-crystal semiconductor substrate;
   forming a porous insulating film over the first conductive film;
   forming a contact hole in the porous insulating film to expose a part of the first conductive film;
   forming a film having a water repellent over the porous insulating film, the contact hole, and the exposed part of the first conductive film;
   forming a region having a hydrophilic surface in a part of the film having the water repellent by irradiating with light the part of the film having the water repellent; and
   forming a second conductive film connected to the first conductive film by discharging and baking a liquid material having a conductive particle over the region having the hydrophilic surface.

14. The method for manufacturing a semiconductor device according to claim 13, wherein the second conductive film serves as a wiring and a plug.

15. The method for manufacturing a semiconductor device according to claim 13, wherein the porous insulating film is formed by applying an insulating material and then heating the insulating material.

16. The method for manufacturing a semiconductor device according to claim 13, wherein the porous insulating film is formed by a plasma CVD method.

17. The method for manufacturing a semiconductor device according to claim 13, wherein the film having a water repellent has a contact angle of 120° or more to water.

18. The method for manufacturing a semiconductor device according to claim 13, wherein the region having a hydrophilic surface has a contact angle of 20° or less to water.

19. A method for manufacturing a semiconductor device comprising:
   forming a porous insulating film over a single-crystal semiconductor substrate;
   forming a contact hole in the porous insulating film; forming a barrier film on a surface of the contact hole and a surface of the porous insulating film;
   forming a film having a water repellent on a surface of the barrier film;
   etching a portion of the film having the water repellent to expose the barrier film in the contact hole;
   irradiating the exposed barrier film with light to form a region having a hydrophilic surface in the exposed barrier film; and
   forming a conductive film by discharging and baking a liquid material having a conductive particle over the region having the hydrophilic surface.

20. The method for manufacturing a semiconductor device according to claim 19, wherein the conductive film serves as a wiring and a plug.

21. The method for manufacturing a semiconductor device according to claim 19, wherein the porous insulating film is formed by applying an insulating material and then heating the insulating material.

22. The method for manufacturing a semiconductor device according to claim 19, wherein the porous insulating film is formed by a plasma CVD method.

23. The method for manufacturing a semiconductor device according to claim 19, wherein the film having a water repellent has a contact angle of 120° or more to water.

24. The method for manufacturing a semiconductor device according to claim 19, wherein the region having a hydrophilic surface has a contact angle of 20° or less to water.

* * * * *